United States Patent
Gresham et al.

(10) Patent No.: US 7,053,717 B2
(45) Date of Patent: May 30, 2006

(54) METHOD AND APPARATUS FOR REALIZING A LOW NOISE AMPLIFIER

(75) Inventors: Robert Ian Gresham, Somerville, MA (US); Ratana Wohlert, Lowell, MA (US); Alan Jenkins, Groton, MA (US)

(73) Assignee: M/A-COM, Inc., Lowell, MA (US)

( * ) Notice: Subject to any disclaimer, the term of this patent is extended or adjusted under 35 U.S.C. 154(b) by 33 days.

(21) Appl. No.: 10/685,264

(22) Filed: Oct. 14, 2003

(65) Prior Publication Data

US 2005/0077966 A1    Apr. 14, 2005

(51) Int. Cl.
*H03F 3/04* (2006.01)
(52) U.S. Cl. .................. 330/310; 330/150; 330/302
(58) Field of Classification Search ............ 330/150, 330/302, 310, 311
See application file for complete search history.

(56) References Cited

U.S. PATENT DOCUMENTS

| | | | | |
|---|---|---|---|---|
| 3,940,706 A | * | 2/1976 | Stegens ................... | 330/286 |
| 4,614,915 A | | 9/1986 | Heston et al. ............ | 330/277 |
| 4,631,495 A | * | 12/1986 | Mueller et al. ........... | 330/310 |
| 5,172,074 A | * | 12/1992 | Shiga ....................... | 330/286 |
| 5,809,408 A | * | 9/1998 | Fujimoto et al. .......... | 330/129 |
| 6,734,730 B1 | * | 5/2004 | Doi et al. ................. | 330/310 |
| 6,806,777 B1 | * | 10/2004 | Franca-Neto ............. | 330/311 |

FOREIGN PATENT DOCUMENTS

EP    0 463 377 A1    1/1992
JP    61181208        8/1986

OTHER PUBLICATIONS

R.J. Yarema, T. Zimmerman, W. Williams, M. Binkley, T. Huffman, R. Wagner, "A High Performance Multi-Channel Preamplifier ASIC," Feb., 1992, pp. 616-620, IEEE, Fermi National Accelerator Laboratory, P.O. Box 500, Batavia, IL 60510.

Wei Meng Lim, Manh Anh Do, Jian Guo Ma and Kiat Seng Yeo, "A Broadband CMOS LNA for WLAN Applications," Apr., 2003, IEEE, School of Electrical and Electronic Engineering, Nanyang Technological University Singapore 639798.

A.H. Ching, G.R. Branner and D.G. Thomas, Jr., "Reduced-Size Low Noise-Low Power Consumption Amplifier Designs for Communications and RF Applications," Apr., 1997, 1379-1382, IEEE, Department of Electrical and Computer Engineering, University of California, Davis, CA 95616.

(Continued)

*Primary Examiner*—Khanh Van Nguyen

(57) ABSTRACT

A multi-stage amplifier including a first amplifier stage including a first transistor, the first transistor selected to provide an optimum noise characteristic, and a second amplifier stage including a second transistor, the second transistor selected to provide an optimum gain characteristic.

17 Claims, 3 Drawing Sheets

OTHER PUBLICATIONS

S.L.G. Chu, R. Wohlert, G. Jackson, M. Adlerstein, J.B. Cole, M. Zaitlin, "A Ka-band HBT Two-stage LNA," Mar., 1994, pp. 307-310, IEEE, Raytheon Company, Research Division, 131 Spring Street, Lexington, Massachusetts, 02173.

Donald G. Thomas, Jr., G.R. Branner, Design of Low-Noise RF/Microwave Amplifiers for Communication Systems Requiring Very Low Power Consumption, Apr., 1996, pp. 1007-1010, IEEE, Department of Electrical and Computer Engineering, University of California, Davis, California, 95616.

Jeffrey A. Lester, W.L. Jones, P.D. Chow, "High Performance MMIC 20 $GH_z$ LNA and 44 $GH_z$ Power Amplifier Using Planar-Doped InGaAs HEMTs," Apr., 1991, pp. 433-436, IEEE, TRW Electronic Systems Group, Redondo Beach, California.

P. Roux, Y. Baeyens, V. Houtsma, A. Leven, J. Weiner, A. Benz, Y.K. Chen, "Single ended to Differential MHEMT Transimpedance Amplifier with 66 dB-$\Omega$ differential Transimpedance and 50 GHz Bandwidth," Jan., 2003, WE5D-6, pp. 1193-1196, IEEE, Lucent Technologies, Bell Laboratories, 16 Av. Descartes, 92352 Le Plessis Robinson, France, 600 Mountain Avenue, Murray-hill, New Jersey, 07974, Optical Networking Group, Nuremberg, Germany.

* cited by examiner

METHOD AND APPARATUS FOR REALIZING A LOW NOISE AMPLIFIER

FIELD OF THE INVENTION

This present invention relates to a low noise amplifier (LNA), and in particular, to an LNA which is made compact through the elimination of matching circuitry.

BACKGROUND OF THE INVENTION

Noise is produced by all electrical components, as well as by ambient conditions surrounding circuitry (e.g., temperature). Noise can be passed into an electrical system by external components, and may also produced by the electrical system itself. Consequently, the intrinsic noise level of a system determines the lower limit or minimum signal strength of a signal that can be detected in the presence of noise. This is usually defined in receiver terms as the system 'sensitivity.'

Typically, the first action of a receiver in detecting an incident signal from an antenna is to amplify the signal's magnitude to make subsequent detection and processing stages easier. This is achieved using an amplifier which increases the amplitude of the signal (S) while simultaneously minimizing the amount of additional noise (N) power added to the signal. It is therefore desirable to maximize the signal-to-noise ratio (S/N) of signals in the receiver. Low Noise Amplifiers (LNAs) accomplish this goal of increasing signal (S) power without concurrently increasing noise (N) power. LNAs are typically implemented in stages, such that each stage includes one or more amplifiers.

The reason for implementing LNAs in stages is as follows. The noise contribution of a single amplifier is a function of many fundamental parameters such as the device type, and its operating bias-point. In addition, other considerations such as the source and load impedance presented to the device, have a particularly strong influence on both the added noise contribution from the amplifier to any input signal, as well as the subsequent gain of the input signal. The magnitude of the input signal is increased by the gain of the amplifier by the same magnitude, as is the incident receiver noise. Any additional noise superposed with the received signal therefore has the overall effect of reducing the S/N ratio. It is therefore more preferable to minimize the noise contribution of the first stage amplifier at the expense of gain, and increase signal magnitude in a second or third stage where the effect of added intrinsic noise is less deleterious to the integrity of the received signal. Thus, by implementing a multi-stage amplifier, the effects of noise can be substantially reduced.

The usual technique for reducing noise in a multi-stage amplifier is through careful inspection of the noise circles or contours associated with the first stage of the multi-stage amplifier. Noise circles (contours) are loci on the complex impedance plane of the magnitude of added noise for a given device and operating point. The source impedance point that results in minimum added noise is selected, and an input matching-circuit implemented. A similar output matching circuit is designed to maximize the signal gain of the amplifier for a given load impedance. Additional amplifier stages are then added which have similar input and output matching circuits to further maximize the gain of the overall circuit, while ensuring that other important criteria such as stability are met. The result of not including such appropriate matching circuitry is often reduced amplifier gain, lowered efficiency, and instability.

The above-described design technique requires the use of lumped element capacitors, resistors, or inductors, or at high frequencies, synthesized matching elements (distributed) through the use of transmission lines. In an integrated circuit (IC) implementation, it is often desirable to minimize the real estate occupied by these elements in order to reduce the production cost of the circuit, by both increasing the number of die/wafer, and increasing the yield (functional number of die/wafer).

In addition, in Silicon (Si) IC implementations, the losses generated by the input, output and inter-stage matching circuits may be substantial. At high frequencies (e.g., greater than 5 GHz), Si is a relatively poor semiconductor substrate with high signal loss. It is therefore possible that the increased signal gain achieved through the use of these input, output, and inter-stage matching circuits is of a similar order of magnitude to the loss introduced by these same components. Similarly, in minimizing the added noise of the first stage amplifier, any loss introduced by input matching circuitry may be of a similar magnitude to the noise produced by an unmatched first stage amplifier. It is therefore possible and conceivable that there could be an instance whereby the overall noise and signal gain of a cascaded amplifier that contains input, output, and inter-stage matching circuitry, could be only marginally, or at worst, no better, than a similar unmatched amplifier should the matching elements have high loss.

In this instance it may be preferable to employ an unmatched amplifier (assuming that stability and other operational parameters are met) due to the advantages it possesses in having reduced size.

As discussed above, the overall noise figure of a multi-stage Low Noise Amplifier (LNA) is affected by the input matching network which couples the input signal to the first amplifier stage, and the inter-stage matching networks disposed between amplifier stages. In integrated circuit (IC) implementations, size reduction is important to reduce cost. Thus, the use of on-die matching networks is an attractive possibility. However, at higher frequencies (e.g., millimeter (mm) wave), and on lossy substrates (e.g., silicon (Si)), the losses created by the matching networks often becomes large enough to mitigate their usefulness.

FIG. 1 shows a conventional LNA 100. The conventional LNA 100 includes an input matching network 110, a first amplifier stage 120, a first inter-stage matching network 130, a second amplifier stage 140, a second inter-stage matching network 150, a third amplifier stage 160, and an output matching network 170. As is well known in the art, the matching networks 110, 130, 150 and 170 allow amplifier stages of different sizes and different gains to be used without experiencing significant signal loss through the LNA 100. The matching networks 110, 130, 150 and 170 also operate to reduce the overall noise figure of the LNA 100. However, the matching networks 110, 130, 150 and 170 also introduce losses into the LNA 100, as would any electrical component.

Thus, there is presently a need for an LNA which is compact (i.e., does not include matching networks) but which also has a minimum overall noise figure.

SUMMARY OF THE INVENTION

An exemplary embodiment of the present invention comprises a multi-stage amplifier including a first amplifier stage with at least one first transistor, the at least one first transistor selected to provide an optimum noise characteristic, and a second amplifier stage with at least one second transistor, the at least one second transistor selected to provide an optimum gain characteristic.

An exemplary embodiment of the present invention also comprises a method for producing a multi-stage amplifier, including the steps of selecting at least one first transistor for a first stage to provide an optimum noise characteristic, and selecting at least one second transistor for a second stage to provide an optimum gain characteristic.

DETAILED DESCRIPTION

Figure 1:
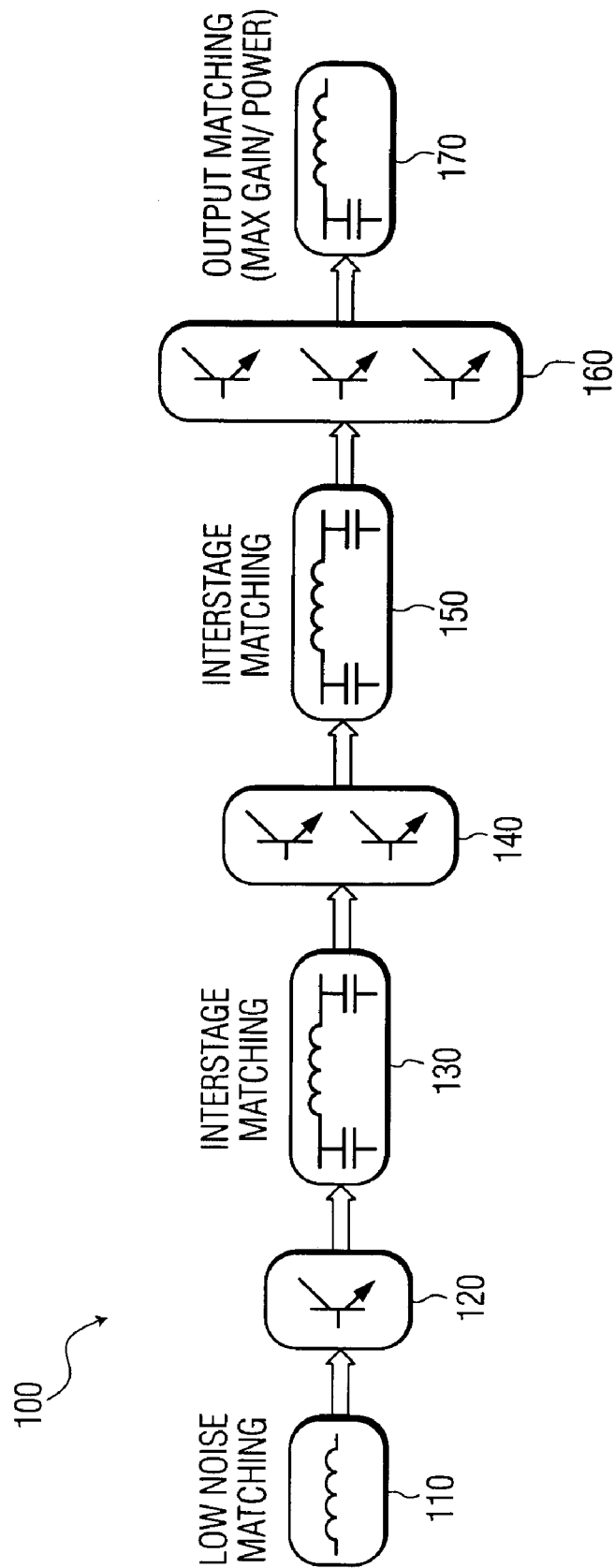
FIG. 1 shows a conventional LNA which includes input, output and inter-stage matching networks.
Figure 2:
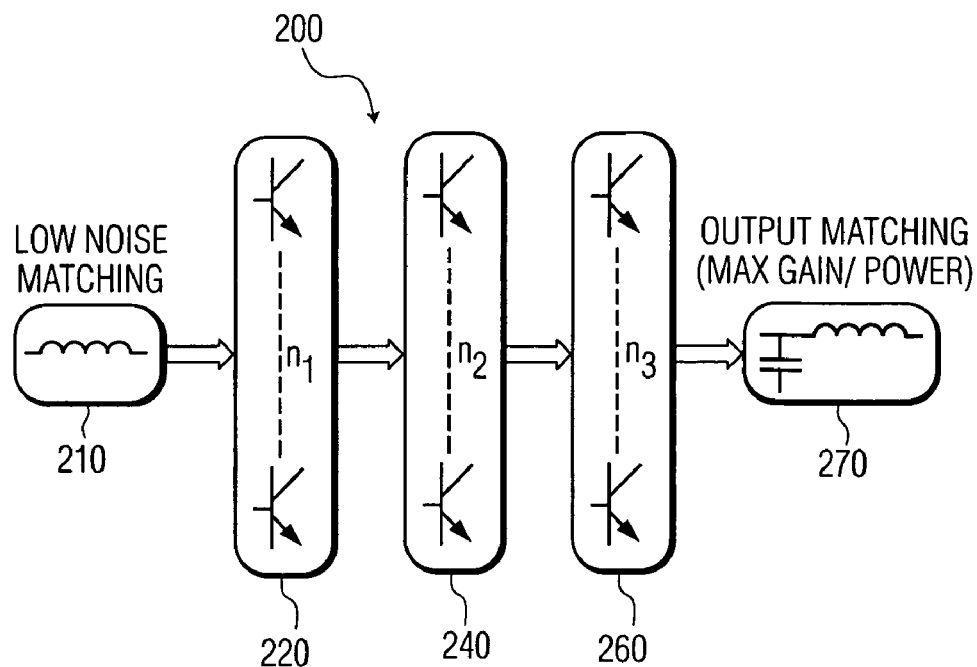
FIG. 2 shows a LNA according to a first exemplary embodiment of the present invention.

FIG. 2 shows a Low Noise Amplifier (LNA) 200 according to a first exemplary embodiment of the present invention. The LNA 200 includes an input matching network 210, a first amplifier stage 220, a second amplifier stage 240, a third amplifier stage 260, and an output matching network 270. It will be noted that, as compared to the conventional LNA 100 shown in FIG. 1, the LNA 200 does not include first and second inter-stage matching networks 130, 150.

Each amplifier stage 220–260 includes a respective number of transistors $n_1$–$n_3$. The number of transistors (e.g., $n_2$), and the type of transistors, in each amplifier stage (e.g., stage 240) is selected so that there is minimal noise inserted into the LNA 200, and so that a maximum gain through the LNA is achieved. In particular, the geometry of each transistor in each stage is altered to obtain optimal noise characteristics and maximum gain through the LNA 200. As is well known in the art, the geometry of a transistor may be altered by varying the volume (i.e., length, width and depth) of the base (B), emitter (E) and collector (C) terminals, respectively.

In the exemplary embodiment shown in FIG. 2, the first amplifier stage 220 has $n_1$ transistors selected so as to achieve a optimum noise characteristic, and the second and third amplifier stages 230, 240 have $n_2$, $n_3$ transistors, respectively, selected so as to achieve a optimum gain characteristic. In a simplified exemplary embodiment, each of the stages 220–240 would have a single transistor, such that the transistor for the first stage 220 would be selected so as to achieve an optimum noise characteristic, and the respective transistor for each of the second and third stages 230, 240 would be selected so as to achieve an optimum gain characteristic. In a preferred exemplary embodiment, each of the stages 220–240 includes a differential transistor pair where both transistors of the pair are identical. Since the input impedance of a transistor, or transistor pair, is a function of the bias point and the geometry of the transistor (e.g., number of emitters, bases, and collectors, area of junctions, etc.), it is preferable that the transistors of a single stage be identical. However, those of ordinary skill in the art will realize that the principles of the present invention may be applied to amplifier stages which include different types of transistors.

The optimum noise characteristic (i.e., minimum noise figure $NF_{opt}$) and optimum gain characteristic (i.e., maximum gain figure $MG_{opt}$) may be identified through examination of the Smith Chart for the associated transistor(s) in each stage. For example, if the first amplifier stage 220 includes two (i.e., $n_1=2$) transistors, the transistors are chosen (i.e., the transistors' geometry is selected) so that the Smith Chart for the first stage has a 'minimum noise circle (loci)' disposed at or near the characteristic source impedance point of the LNA 200. Continuing with this example, the transistors of the second and third amplifier stages 230, 240 are chosen (i.e., the transistors geometry is selected) so that the Smith Chart for each of the second and third stages have an 'optimum gain circle (loci)' disposed at or near the output impedance point of the first amplifier stage 220 and the second amplifier stage 230 of the LNA 200.

It will be noted that every LNA (e.g., LNA 200) has an optimum source impedance (for minimum noise figure, $NF_{opt}$), located at a particular point in the impedance plane of the Smith Chart. As the source impedance (for a given amplifier configuration) deviates from this optimum point, loci representing the degradation of the noise figure from the optimum point can be mapped onto the Smith Chart corresponding to a degradation of 0.1 dB, 0.5 dB, 1 dB, etc. with increasing radius. As the loci increase in size, they eventually encompass the input impedance point of the LNA.

For example, if the encirclement corresponds to a degradation of 1 dB from the $NF_{opt}$ point, an input matching circuit is typically used to transform the source impedance of the LNA to the input impedance of the LNA, in order to present the LNA with the optimum source impedance such that $NF_{opt}$ is reached. However, with lossy matching elements, the loss of such an input matching circuit may be more than 1 dB (e.g., 1.2 dB). Therefore, although the LNA has an optimum source impedance, its noise figure is, in fact, worse than if it had been left unmatched.

Continuing with the above example, an LNA whose 'natural' minimum noise figure $NF_{opt}$ is the same as its real source impedance (e.g., 50 Ω) may be chosen, rather than using an input matching network. A transistor with an appropriate combination of transistor geometry and bias point may be selected to achieve this matching condition as a first stage (e.g., stage 220) transistor. Additional transistors with an appropriate combination of transistor geometry and bias point may then be selected for second and third stages (e.g., stages 240, 260) so that the second and third stages of the LNA have a 'natural' maximum gain figure $MG_{opt}$ that is the same as the output impedance of the first and second stages of LNA.

Figure 3:
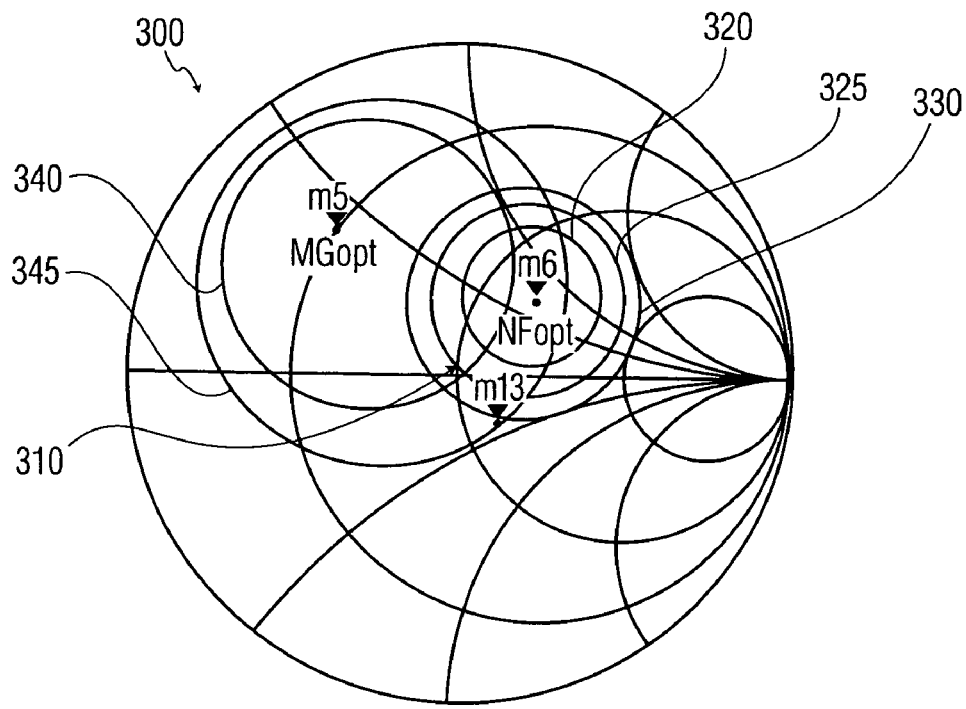
FIG. 3 is a diagram showing a Smith Chart for an LNA according to the first exemplary embodiment of the present invention.

FIG. 3 is a Smith Chart 300 for an exemplary LNA (e.g., LNA 200). Reference numeral 310 designates the center of the Smith Chart 300 which represents the system impedance of the LNA (e.g., 50 Ω). Circles 320, 325 and 330 represent loci of the constant noise figure. Circles 340 and 345 represent loci of constant gain. Thus, the center of the set of concentric noise circles 320, 325, 330 represents the minimum noise figure ($NF_{opt}$) of the LNA, and is represented by marker m6. Similarly, the center of the set of concentric gain circles 340 and 345 represents the maximum gain figure ($MG_{opt}$) of the LNA, and is represented by marker m5. The intersection of a gain and noise circle (e.g., gain circle 345 and noise circle 330) represents an impedance that, when presented to the LNA, will yield that combined gain and noise figure. For example, marker m13 represents the intersection of gain circle 345 and noise circle 330, and an impedance that is the combination of these noise and gain circles. To achieve this point (at marker m13), a matching network is necessary to transform the system impedance of the LNA to this new impedance level (i.e., to move the intersection represented by marker m13 close to the center of the Smith Chart). However, it will be noted that another set of noise and gain circles (e.g., noise circle 325 and gain circle 340) intersect near the center of the Smith Chart 300 (i.e., the system impedance point). Thus, a noise and gain combination which substantially represents the system impedance of the LNA may be achieved without the need for any matching network.

There is a trade-off between optimum bias point, optimum geometry, and operating frequency that has to be considered to make this selection, hence the requirement for multiple transistors, and varying geometry. This thought can then be further extended to the subsequent stages where optimum gain is the goal.

By adjusting device (e.g., transistor) size, and/or the number of devices in each amplifier stage 220, 240, 260 it is possible to come to a compromise in gain and noise figure where no matching is required and the effective source match and inter-stage match is provided by varying the geometry of the device in each stage. This can also significantly reduce the size of the finished LNA 200.

In particular, as the device parameters (e.g., size, number, geometry, etc.) are varied, so are the noise and gain circles in the corresponding Smith Chart. As discussed above, the noise and gain circles may be modified such that at least one gain circle and at least one noise circle intersect at a point at or near the system impedance of the LNA (i.e., the approximate center of the Smith Chart).

The particular magnitude and location of the noise loci and gain loci for a particular transistor are a function of the device size and bias point. By carefully selecting a particular device size and operating point, the optimum noise locus for a first stage amplifier (e.g., in first amplifier stage 220) may be the same or similar to the characteristic source impedance of the system. Similarly, by selecting subsequent differently sized transistors with suitable bias points, additional amplification stages (e.g., second and third amplifier stages 240, 260) may be included that are also matched to the appropriate source impedance.

It therefore becomes possible to design a multi-stage, low-noise amplifier that is very compact (through the elimination of inter-stage matching networks), but that provides satisfactory gain and added noise characteristics. Input and output matching networks 210 and 270 may still be used to make the multi-stage amplifier compatible with input and output load impedances. It would also be possible to use a similar technique of scaling transistors at appropriate bias points to minimize the extent of the additional matching circuitry required to further enhance performance while reducing the occupied IC area.

Figure 4:
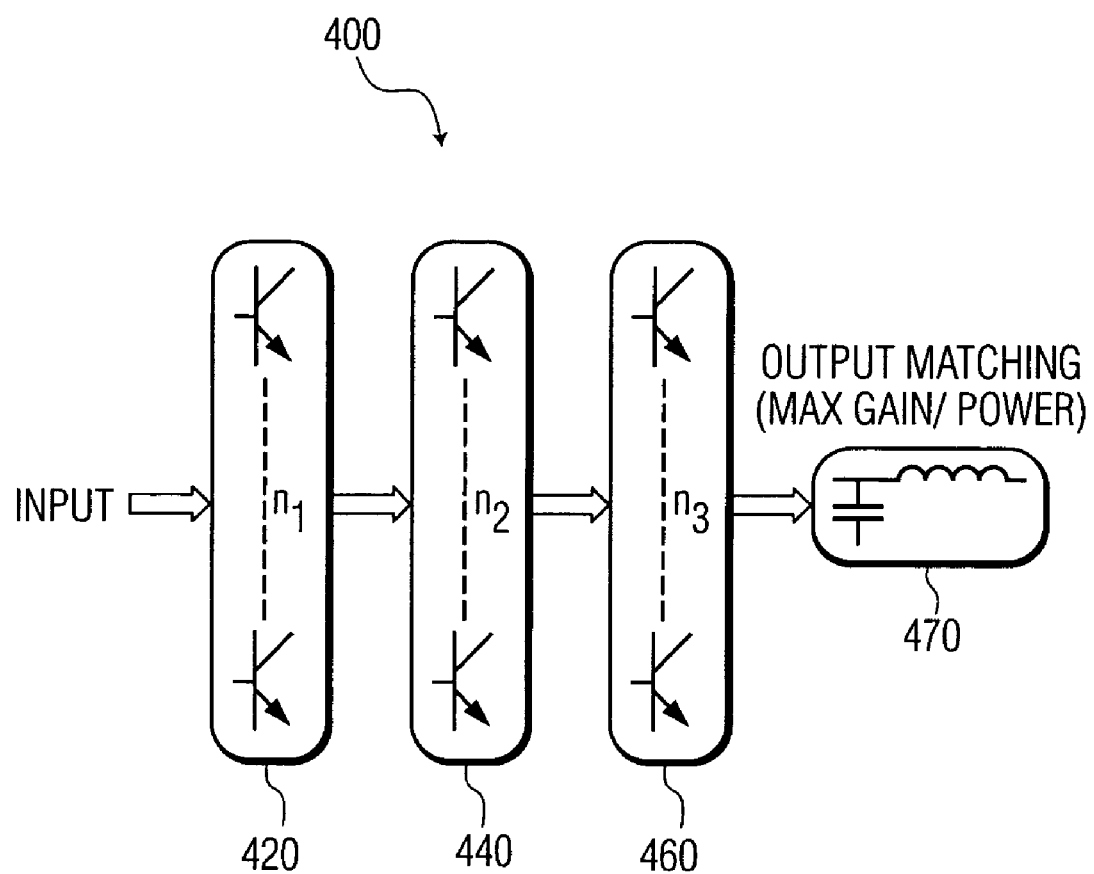
FIG. 4 shows a LNA according to a second exemplary embodiment of the present invention.

FIG. 4 shows a Low Noise Amplifier (LNA) 400 according to a second exemplary embodiment of the present invention. The LNA 400 includes a first amplifier stage 420, a second amplifier stage 440, a third amplifier stage 460, and an output matching network 470. It will be noted that, as compared to the LNA 200 shown in FIG. 2, the LNA 400 does not include an input matching network (e.g., input matching network 210). The input matching network is eliminated through careful selection of the transistors in the first stage 420. In particular, the number of transistors (e.g., $n_1$), and the type of transistors, in the first amplifier stage 420 are selected to obtain an optimum gain characteristic.

As with the LNA 200 described above, each amplifier stage 420–460 includes a respective number of transistors $n_1$–$n_3$. The number of transistors (e.g., $n_2$) in each amplifier stage (e.g., stage 440) is selected as described above with reference to FIG. 2, and thus an explanation of the method is omitted here.

It therefore becomes possible to design a multi-stage, low-noise amplifier (e.g., LNA 400) that is very compact (through not having input and inter-stage matching networks), but that provides satisfactory gain and added noise characteristics. An output matching circuit (e.g., 470) may be used to transform the final stage of the multi-stage amplifier to be compatible with subsequent load impedances. It would also be possible to use a similar technique of scaling transistors at appropriate bias points to minimize the extent of the additional matching circuitry required to further enhance performance while reducing the occupied IC area.

Although the exemplary LNAs 200, 400 described above both include at least three amplifier stages each, it will be noted that the principles of the present invention are applicable to LNAs including any number of amplifier stages (e.g., 1, 2, 3, 4, etc.). It will also be understood by those skilled in the art that the above-described method of selecting transistors may be applied to transistors formed monolithically, as well as packaged discrete transistors.

Although the invention has been described in terms of exemplary embodiments, it is not limited thereto. Rather, the appended claims should be construed broadly to include other variants and embodiments of the invention which may be made by those skilled in the art without departing from the scope and range of equivalents of the invention.

What is claimed is:

1. A multi-stage amplifier comprising:
   a first amplifier stage including at least one first transistor, said at least one first transistor selected to provide an optimum noise characteristic; and,
   a second amplifier stage including at least one second transistor, said at least one second transistor selected to provide an optimum gain characteristic,
   wherein one of the at least one first transistor or the at least one second transistor are selected such that at least one noise circle corresponding to the at least one first transistor or at least one second transistor and at least one gain circle corresponding to the at least one first transistor or at least one second transistor intersect at or near the center of a corresponding Smith Chart for the multi-stage amplifier.

2. The multi-stage amplifier of claim 1, further comprising: a third amplifier stage including at least one third transistor, said at least one third transistor selected to an optimum gain characteristic.

3. The multi-stage amplifier of claim 1, further comprising: an input matching network coupled to an input of the first stage.

4. The multi-stage amplifier of claim 1, further comprising:
   an output matching network coupled to an output of the second stage.

5. The multi-stage amplifier of claim 2, further comprising:
   an output matching network coupled to an output of the third stage.

6. The multi-stage amplifier of claim 1, wherein the at least one first transistor comprises a specific number transistors selected to provide an optimum noise characteristic.

7. The multi-stage amplifier of claim 1, wherein optimum gain characteristic is provided by selecting an appropriate geometry for the at least one second transistor.

8. The multi-stage amplifier of claim 2, wherein optimum gain characteristic is provided by selecting an appropriate geometry for the at least one third transistor.

9. The multi-stage amplifier of claim 1, wherein the optimum noise characteristic is provided by selecting an appropriate geometry for the at least one first transistor.

10. A method for producing a multi-stage amplifier, comprising the steps of:
selecting at least one first transistor for a first stage to provide an optimum noise characteristic; and,
selecting at least one second transistor for a second stage to provide an optimum gain characteristic,
wherein one of the at least one first transistor or the at least one second transistor are selected such that at least one noise circle corresponding to the at least one first transistor or at least one second transistor and at least one gain circle corresponding to the at least one first transistor or at least one second transistor intersect at or near the center of a corresponding Smith Chart for the multi-stage amplifier.

11. The method of claim 10, comprising the further step of:
selecting at least one third transistor for a third stage to provide an optimum gain characteristic.

12. The method of claim 10, wherein the step of selecting at least one second transistor for the second stage to provide an optimum gain characteristic comprises selecting an appropriate geometry for the at least one second transistor.

13. The method of claim 11, wherein the step of selecting at least one third transistor for the third stage to provide an optimum gain characteristic comprises selecting an appropriate geometry for the at least one third transistor.

14. The method of claim 10, comprising the further step of:
selecting an output matching network, said output matching network being coupled to an output of the second stage.

15. The method of claim 11, comprising the further step of:
selecting an output matching network, said output matching network being coupled to an output of the third stage.

16. The method of claim 10, wherein the step of selecting at least one first transistor for the first stage to provide an optimum noise characteristic comprises selecting an appropriate geometry for the at least one first transistor.

17. A method for producing a multi-stage amplifier, comprising the steps of:
selecting at least one first transistor such that at least one noise circle and at least one gain circle intersect at or near the center of a corresponding Smith Chart for the amplifier; and,
selecting at least one second transistor such that at least one noise circle and at least one gain circle intersect at or near the center of the corresponding Smith Chart,
wherein the step of selecting at least one first transistor for the first stage to provide an optimum noise characteristic comprises selecting an appropriate geometry for the at least one first transistor.

* * * * *